United States Patent
Kendall et al.

(10) Patent No.: US 6,908,255 B2
(45) Date of Patent: Jun. 21, 2005

(54) REMOTE CLAMPING MECHANISM VIA VACUUM FEEDTHROUGH

(75) Inventors: Rodney A. Kendall, Ridgefield, CT (US); Lonn E. Moore, Fishkill, NY (US); David J. Pinckney, Newtown, CT (US); Richard A. Rieland, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,078

(22) Filed: Jun. 25, 2003

(65) Prior Publication Data

US 2004/0265052 A1 Dec. 30, 2004

(51) Int. Cl.$^7$ .............................. F16B 7/04; A61N 5/00
(52) U.S. Cl. ................ 403/374.5; 403/373; 403/374.2; 403/DIG. 9; 250/492.2; 250/442.11
(58) Field of Search .................... 250/492.2, 442.11; 269/254 CS; 403/373, 374.2, 374.5, 379.6, DIG. 9, 110–113, 116, 117, 119, 120, 149, 166

(56) References Cited

U.S. PATENT DOCUMENTS

| | | | | |
|---|---|---|---|---|
| 2,682,694 A | * | 7/1954 | Kempkes | 269/254 CS |
| 2,712,769 A | * | 7/1955 | Prescott | 269/254 CS |
| 6,419,536 B1 | * | 7/2002 | Oguma | |
| 6,437,347 B1 | | 8/2002 | Hartley | |

* cited by examiner

*Primary Examiner*—Daniel P. Stodola
*Assistant Examiner*—Victor MacArthur
(74) *Attorney, Agent, or Firm*—Jay H. Anderson

(57) ABSTRACT

A clamping flexure for use in a vacuum employs a spring-loaded shaft that pulls an object being supported against a support piece, including a mechanism, passing through the vacuum vessel, for releasing the spring tension during adjustment, the shaft being sufficiently compliant that restoring force after adjustment is less than a threshold value so that displacement of the shaft does not impress a force on the object being supported that returns it toward its position before adjustment.

10 Claims, 4 Drawing Sheets

REMOTE CLAMPING MECHANISM VIA VACUUM FEEDTHROUGH

BACKGROUND OF INVENTION

The field of the invention is that of vacuum technology, in particular clamping methodology for applications requiring remote vacuum access with large clamping forces that apply little transverse force components to a positioned target when clamped.

Electron beam (e-beam) lithography tools are commonly used in semiconductor manufacturing to form sub-micron shapes on a semiconductor wafer. Shapes are formed by directing a beam of electrons from a source at one end of a column onto a photoresistive layer on a substrate at an opposite end of the column. A typical substrate may be 200–300 mm in diameter or larger. These submicron shapes may be formed either by writing the shape directly onto a photoresistive layer on the substrate, wherein the substrate is a semiconductor wafer; or, by writing the shape onto a photoresistive layer on a substrate which is used as a mask, subsequently, to print the shape onto the semiconductor wafer.

Further, there are two broad types of writing modes used in electron beam lithography. The first type is referred to as "blind mode" or a "dead reckoning mode" and is commonly used in mask making. In the blind mode, the substrate is a featureless blank coated with resist and all of the patterns are placed by dead reckoning. The second mode, which may be referred to as the "registered write mode" or a "direct write mode," is commonly used in direct write applications, i.e. writing directly onto a semiconductor wafer, in what are referred to as device fabrication runs. In the registered write mode case, the patterns must be precisely located relative to previous levels, which requires registration targets built into each level and the substrate as well. Regardless of the mode employed, accurately placing or repeating sub-micron shapes at precise locations across a distance of 200–300 mm demands precise beam registration.

However, even if the beam is registered adequately when pattern printing begins, during the course of writing the pattern, the e-beam may exhibit what is referred to as drift, i.e., exhibiting increasing inaccuracy in one direction as time passes. So, in order to maintain adequate precision, pattern writing may be interrupted periodically, depending on the particular tool's inherent e-beam drift, to check tool registration and, whenever registration error exceeds an acceptable tolerance, to adjust the beam.

Normally, the substrate is held on a stage opposite (beneath) the beam source and this registration measurement involves diverting the stage to position a registration target under the beam. Then, the beam is scanned over the registration target, the target's location is measured and the target's measured location is compared against an expected result. Any measured errors are corrected by adjusting the beam or adjusting stage positional controls. Then, the stage is returned to its former position to resume writing the mask pattern. This measurement and reregistration can be time consuming.

Furthermore, for this e-beam registration approach, the registration measurement takes place at a stage location other than where the pattern is actually written. Consequently, even after measuring and correcting errors, moving the stage back into position from the measurement area may actually introduce errors, such as from the stage slipping or from other move related stresses. Also, to assure complete accuracy, the beam should be reregistered, frequently, preferably at each field. However, when throughput is a consideration, as it nearly always is, it is impractical to correct the beam registration prior to printing each field.

U.S. Pat. No. 6,437,347, entitled "Target Locking System for Electron Beam Lithography" to Hartley et al., teaches an e-beam exposure system that may use the invention in its calibration subsystem. This system uses a field locking target that includes alignment marks.

The '347 patent shows an e-beam lithographic system capable of in situ registration. The preferred system is a Variable Axis Immersion Lens (VAIL) e-beam system and is a double hierarchy deflection system. A controllable stage moves a substrate with respect to the beam axis placing the intended substrate writing field within an aperture on a field locking target. The field locking target is located between the optics section and the substrate and the aperture is sized to permit the beam to write the field. The field locking target includes alignment marks around the aperture. A differential interferometric system measures the relative positions of the field locking target and the stage. As the stage is moving into position for writing a field, the beam is swept to hit the alignment marks, checking system alignment. The beam control data (coil currents and electrostatic deflection plate voltages) required to hit the marks are stored, and drift correction values calculated and the field beam control data adjusted accordingly.

FIG. 5 shows a cross-sectional diagram of a typical e-beam lithography system 500. This system includes an optics section 502 with a registration focus coil 504a, an autofocus coil 504b, beam deflection coils 506, 508, a projection lens axis shifting yoke 510 and beam deflection plates 511.

An e-beam source 90 emits a beam represented by arrow 512, which, during writing, travels to a target field on a substrate held on carrier 514. Autofocus coil 504b adjusts beam focus for target height variations resulting from substrate imperfections, thickness variations, etc. In the preferred VAIL lens system, double deflection yokes 506, 508 magnetically deflect the beam 512; and axis shifting coil 510 shifts the variable axis of the projection lens to follow the deflected beam 512. The relatively slow magnetic deflection from coils 506, 508 determines the subfield location, while within the subfield, the beam 512 is deflected by the high speed electrostatic deflection plates 511.

A passive field locking target 516 permits the beam 512 to write the pattern in the substrate's target field through an aperture 518. The preferred aperture is rectangular and is large enough to permit writing an entire field. During normal pattern writing, substrate subfields are placed within the field locking target aperture 518 and electrostatic deflection is used to write spots which form the pattern shapes. During registration, the subfield is defined as being over marks on the field locking target 516 adjacent to the aperture 518; and, the beam is deflected accordingly, as represented by arrows 512'. Then, the marks on the field locking target 516 are scanned, in situ, with the electrostatic deflection, to provide near real time positional feedback information.

For tracking and selecting stage location, the e-beam system 500 includes a differential interferometric system 520. The interferometric system 520 directs a laser, represented by arrows 522, to laser targets 524 and 524' to measure the relative position of the field locking target 516 to the stage mirror assembly 526. Laser target 524 is mechanically coupled to field locking target 516 and laser target 524' is attached to a stage mirror assembly 526. The carrier 514 is kinematically clamped to the stage mirror assembly 526 at points 528. The stage mirror assembly 526, in turn, is flexure mounted to a stage base 530 at points 532. An x or y drive 534 is attached to an appropriate side of the stage base 530 to drive the stage, typically under computer control, in the x or y direction; and, once in place, to lock the stage in place. A mechanical centering adjustment 536 provides a fine adjustment for the field locking target 516 to precisely place it with respect to the beam.

Thus, there is a need for a system that clamps registration marks and other objects for an e-beam lithography system in position, in situ and under vacuum.

SUMMARY OF INVENTION

The invention provides an apparatus for clamping without imposing any significant transverse motion on the object being clamped.

A feature of the invention is the exertion of compressive force on an object by the application of tensile force within a clamping member.

Another feature of the invention is a clamping system for the application of clamping force in a vacuum environment activated in atmosphere where vacuum must be maintained during an adjustment and clamp procedure.

Yet another feature of the invention is a force application system in which a sizable clamping force is applied through a member that does not permit the application of a transverse force.

DETAILED DESCRIPTION

Figure 1:
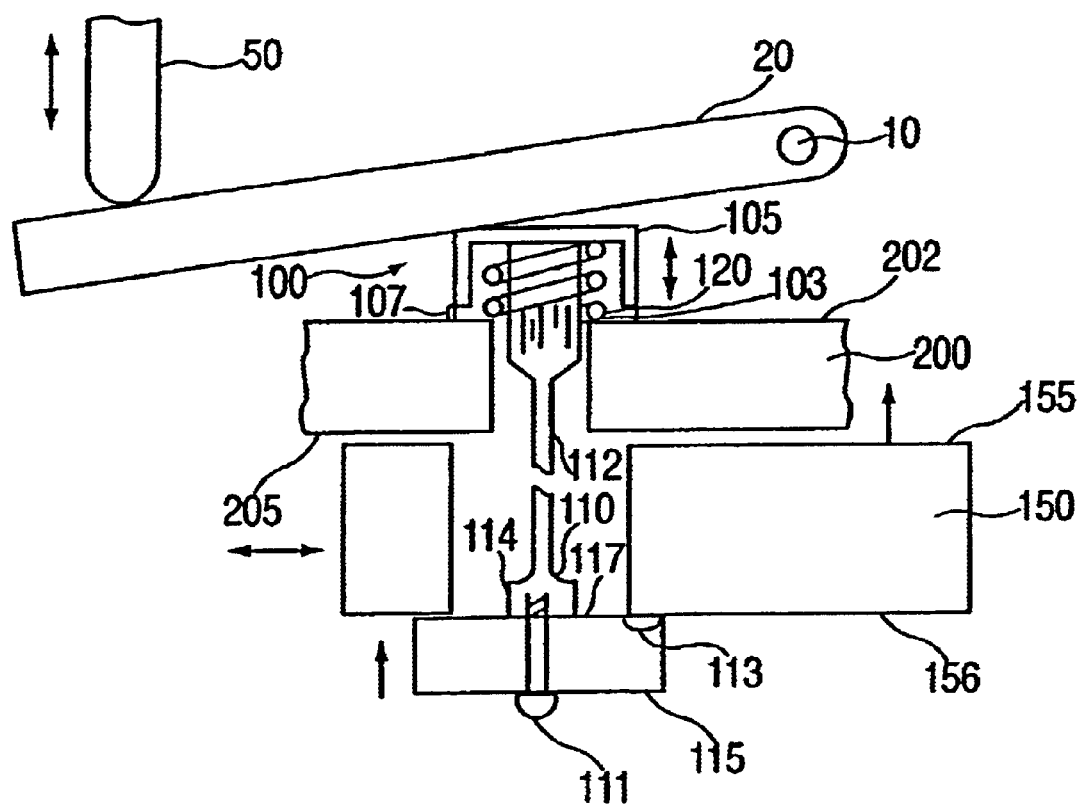
FIG. 1 illustrates a section of a clamping apparatus according to an embodiment of the invention.

FIG. 1 illustrates a clamping member, or flexure, denoted generally with the numeral 100 and indicating an apparatus comprising cap 105, which receives releasing force to release the clamping action from lever 20; lower base 115, which applies an upward force that performs the clamping; and shaft 110, connecting the upper cap and the lower base and passing through holes in the object and support.

The clamping force clamps object 150, which is illustratively a fixture in an electron beam system that is aligned with the beam, to support member 200, which is part of a fixed frame that supports the object 150.

In more detail, cap 105 encloses a spring 120 that supplies the clamping force. Illustratively, the clamping force is approximately 100 pounds, which will vary with the positioning return force, the amount of vibration, etc. that acts to move the clamped object from its correct position and with the amount of friction between the reference surface 155 of the object and the corresponding reference surface 205 of the support member.

Spring 120 presses against the top support surface 202 of support member 200 (on first contact surface 103) and the inner surface of cap 105, pushing cap 105 upward. That upward force pulls base 115 up against the support surface 156 of object 150 through the contact area indicated by 113 on a second contact surface 117, which, in turn pushes the reference surfaces together.

Shaft 110, which acts as a tension member applying the tension or pulling force to base 115, has a central portion 112 which is deliberately made thin as described below.

Base 115 is attached to shaft 110 after object 150 is put in place, the attachment method in this illustrative case being a screw 111. Those skilled in the art will be able to devise many other attachment methods. For example, slots could be used in one or both of object 150 and support 200, so that object 150 would be inserted after the flexure 100.

Springs (not shown) supply force so that object 150 and support 200 are kept in contact. With the object 150 spring loaded against the support, the planar variation when clamped is minimized. The tolerance with a three point shelf lip over such a large distance may result in a larger planar "shift" when clamped that would be acceptable only when it is within tolerance.

In operation, actuator 50 presses down on lever 20, which pivots on pin 10. Lever 20 is positioned so that it depresses cap 105 against the restoring force of spring 120, releasing the clamping force holding object 150 in contact with support 200. Object 150 is then supported by base 115. In the case illustrated there were 12 extension springs offsetting the weight and actually applying a small force to keep 150 and 200 in contact with minimal friction.

With the clamping force released, it is then possible to adjust the position of member 150 by conventional adjusting means not shown in this figure to move member 150 left and right in the figure and in and out of the plane of the paper.

The dimension of the central portion 112 of the shaft is selected in consideration of minimizing the dimension to reduce interfering force, with assembly and manufacturing considerations favoring increasing the cross section for a less fragile part.

Ideally, shaft 110 would not deflect at all during the adjustment process, so that there would be no concern about the restoring force from the deflected shaft undoing the adjustment. An extremely stiff clamping system in the transverse direction would, however, exert a correspondingly strong restoring force in response to any deflection did occur, so that the restoring force would tend to undo the adjustment.

If the shaft were selected to be extremely flexible, e.g. like a string, it would deflect a great deal during the adjustment process, and add assembly and manufacturing complexity.

The process is complicated by the fact that it is performed in vacuum, so that typical adjustment methods used in atmosphere for ordinary mechanical adjustments are not available or are impractical.

In a practical system, the stiffness (resulting from the material of shaft 110 and its diameter, particularly the diameter of portion 112) will be selected in consideration of the friction exerted by the clamp such that the deviation from the adjusted position is within the relevant error budget.

Referring again to FIG. 1, cap 105 is separated from the upper surface of support 200 by a gap indicated by 107, nominally 3 mm. Lever 20 will lower base 115 by (at most) this distance. In another example, the cap is in a counter bore and lever 20 bottoms on the top surface of support 200 for a hard stop (2 mm). The lowered distance is also the separation between the upper surface of member 150 and the lower surface of support 200 during the adjustment process.

The material of the shaft is illustratively type 300 stainless steel and has a nominal diameter in sections 114 and 116

(chosen for convenience) of 7.5 mm. The central portion of the shaft is reduced by electric discharge machining (Wire EDM) to a square cross section 1.5 mm on a side over a distance of about 20 mm. This method works well to make the shaft from a single piece and minimize cross section. Larger diameters in portion 112 would allow for lathe turning. These dimensions are not critical and may be adjusted in view of the stiffness of the material and the magnitude of the allowed restoring force. In the example illustrated, the transverse force was selected to be less than a threshold value in order to avoid danger of sliding object 150 after the adjustment, with a minimum cross section subject to consideration of part robustness during assembly.

Figure 2:
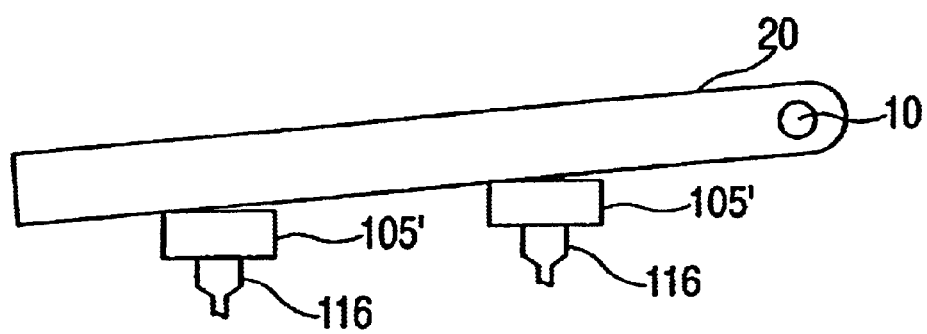
FIG. 2 illustrates a detail of an alternative embodiment.

FIG. 2 illustrates an alternative version of the invention, in which lever 20 deflects two clamps, having caps 105'. The design of this alternative will allow for the difference in deflection between the two clamps. Each clamp may apply a clamping force to the same object or to different objects, as a design choice.

Figure 3:
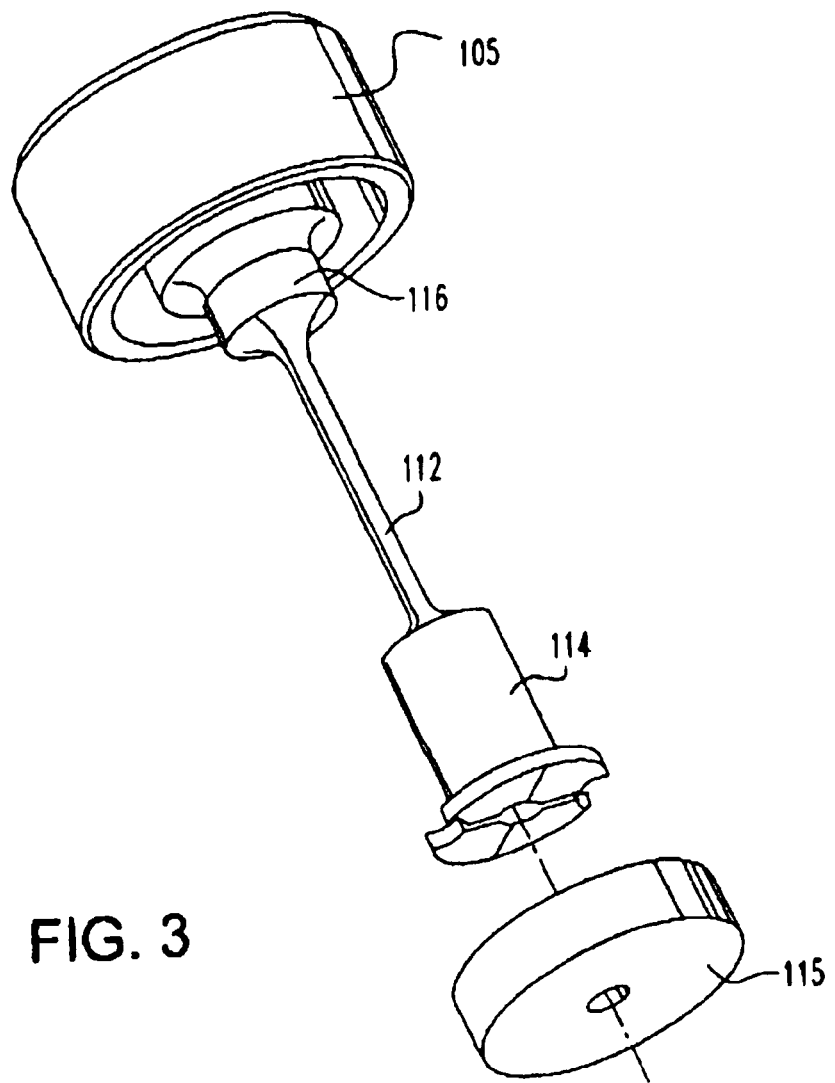
FIG. 3 illustrates the clamping member of FIGS. 1 and 2 in perspective.

FIG. 3 illustrates the clamping device in perspective, showing cap 105 with space for spring 120 (omitted for clarity in the drawing), the upper portion 116 of the central shaft, lower portion 114 and the reduced diameter of the central portion 112. Base 115 is shown as displaced in order to show the bottom surface of the shaft.

Figure 4:
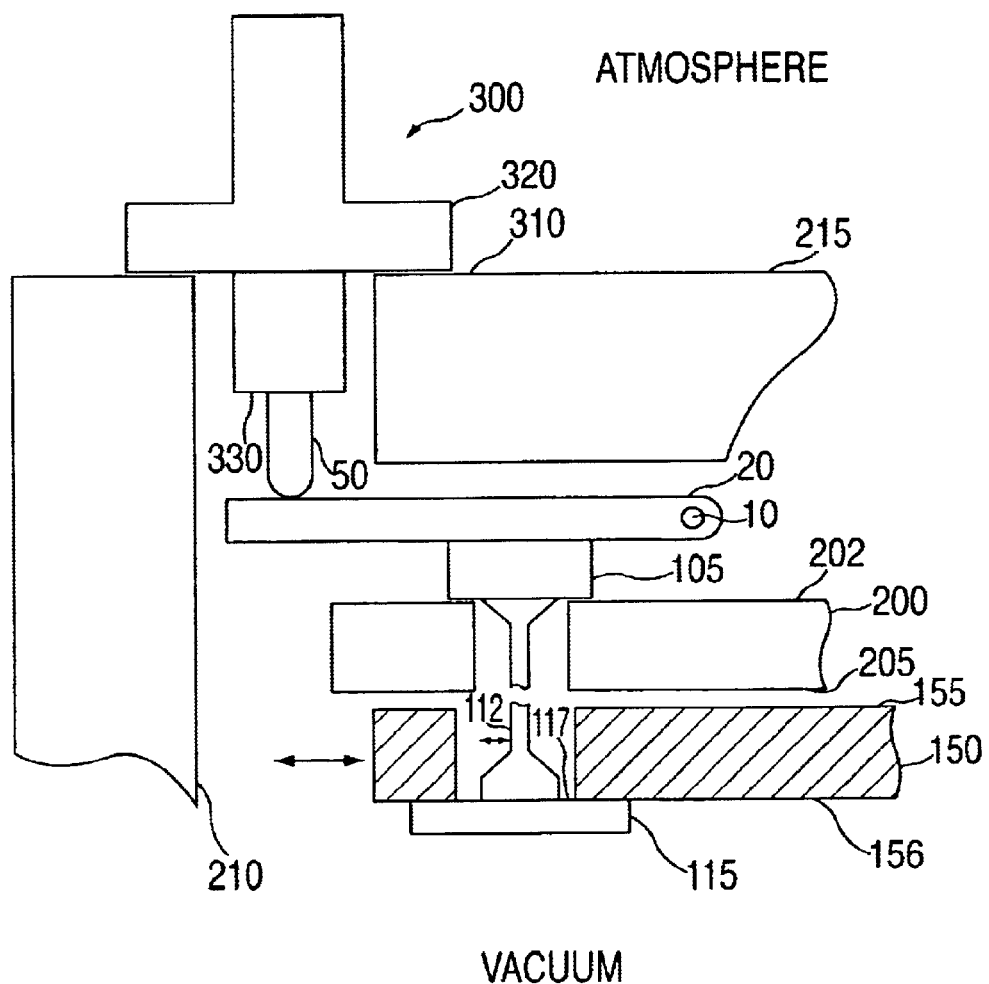
FIG. 4 illustrates a larger portion of an apparatus, including the vacuum enclosure.
Figure 5:
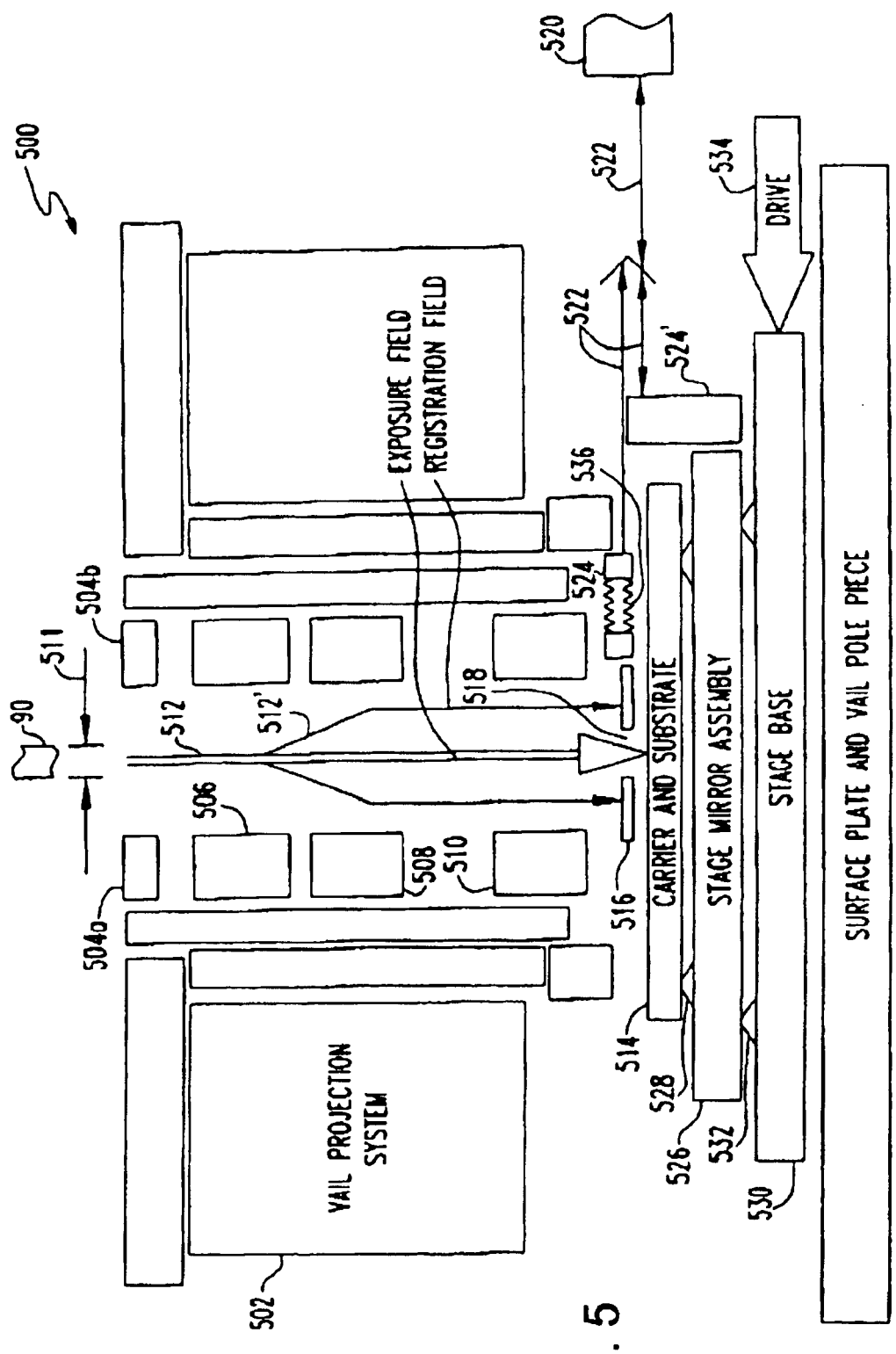
FIG. 5 illustrates an overall view of a prior art system in which the invention may be advantageously used.

FIG. 4 shows a view of a larger portion of an assembly, including the actuator and the vacuum wall. On the left and the top of the Figure, rectangles 210 and 215 are part of the vacuum wall enclosing a vacuum vessel that contains the overall apparatus that includes the clamps. Actuator 300 passes through the vacuum wall, sealing against the vacuum with a flange 320 and sealant 310. Within the vacuum vessel, an actuator 330 drives pin 50 to depress lever 20 as discussed above. This version is preferred, but it may be desirable to place an actuator in the vacuum with the actuator acting on lever 20 or directly on cap 105. One of the features is remote clamp/unclamp; another feature is that the lever allowed the use of a commercial actuator to achieve high clamp force. Another feature is the ability to clamp both inner and outer rings with one actuator.

Lever 20 forces down cap 105 of the clamp to lower base 115 from contact with the object being clamped 150, so that it may be adjusted. Surfaces 155 and 205, normally in intimate contact to maintain sufficient friction to resist displacement remain in contact. The contact force is greatly reduced so that (1) the flexible clamp is not affected, and (2) the adjustment is made with the object "in plane".

The invention has been illustrated in the context of an electron-beam system and operating within a vacuum environment. Those skilled in the art will appreciate that the invention may be used in other environments.

While the invention has been described in terms of a single preferred embodiment, those skilled in the art will recognize that the invention can be practiced in various versions within the spirit and scope of the following claims.

What is claimed is:

1. An apparatus for clamping a reference surface of an object to a reference surface of a support member in a vacuum, comprising:

at least one clamping member having means for applying compressive force between a first contact surface and a second contact surface, said first contact surface being in contact with a support surface of said support member, said support surface of said support member being opposite said reference surface of said support member;

each of said clamping members having a base member with said second contact surface in contact with a support surface of said object, said support surface of said object being opposite said reference surface of said object, such that said base member supports said object when clamped;

each of said clamping members having a tension member passing through holes in said support member and said object for applying force to said base member and for supporting said object when said force is released, said tension member being adapted to maintain a tensile force and having a cross section adapted such that said tension member exerts transverse force on said object less than a threshold amount in response to transverse displacements of said clamping member such that the deviation from an adjusted position is within a relevant error budget;

release means for releasing tension in said tension member, whereby said base member moves away from said support member, thereby opening a gap between said object and said support member; and an actuator passing through a vacuum wall into said vacuum connected to said clamping member for applying and releasing force to said clamping member.

2. An apparatus according to claim 1, in which said means for applying compressive force is a spring and said first contact surface is a surface of said spring.

3. An apparatus according to claim 2, in which support means supports the object when the compressive force is released.

4. An apparatus according to claim 2, in which said tension member is a shaft having a broader diameter at the top and bottom and a smaller diameter in a central area.

5. An apparatus according to claim 1, wherein said release means is also for releasing compressive force.

6. An apparatus according to claim 5, in which said release means comprises a lever pressing against said means for applying compressive force.

7. An apparatus according to claim 6, in which said tension member is a shaft having a broader diameter at the top and bottom and a smaller diameter in a central area.

8. An apparatus according to claim 5, in which said tension member is a shaft having a broader diameter at the top and bottom and a smaller diameter in a central area.

9. An apparatus according to claim 1, in which support means supports the object when the compressive force is released.

10. An apparatus according to claim 1, in which said tension member is a shaft having a broader diameter at the top and bottom and a smaller diameter in a central area.

* * * * *